United States Patent [19]

Barrell et al.

[11] 4,420,509

[45] Dec. 13, 1983

[54] COPPER-CLAD POLYESTER-GLASS FIBER LAMINATES

[75] Inventors: David Barrell, Temple City; Donald E. Kennedy, Baldwin Park; James J. Marino, Jr., Monrovia; Donald C. Rollen, Railto, all of Calif.

[73] Assignee: Glasteel Tennessee, Inc., Collierville, Tenn.

[21] Appl. No.: 291,929

[22] Filed: Aug. 11, 1981

[51] Int. Cl.³ .............................................. B05D 3/00
[52] U.S. Cl. ................................... 427/206; 427/369; 427/370; 427/385.5; 427/388.1; 428/430; 428/433; 428/458; 428/480
[58] Field of Search ............... 428/433, 430, 458, 480; 427/206, 369, 388.1, 370, 385.5

[56] References Cited

U.S. PATENT DOCUMENTS 4,093,768  6/1978  Cordts ................................. 428/458
4,314,002  2/1982  Oizumi et al. ....................... 428/458

FOREIGN PATENT DOCUMENTS 5097951  1/1979  Japan .................................. 428/458

Primary Examiner—George F. Lesmes
Assistant Examiner—E. Rollins Buffalow
Attorney, Agent, or Firm—Lyon & Lyon

[57] ABSTRACT

A metal foil laminate including at least one sheet of metal foil directly bonded to one face of a sheet of glass fiber reinforced polyester resin, and a continuous process for preparing such laminates.

13 Claims, 2 Drawing Figures

COPPER-CLAD POLYESTER-GLASS FIBER LAMINATES

BACKGROUND OF THE INVENTION

The invention relates to laminates of reinforced polyester bonded to metal sheets.

Electrical circuit boards are prepared by laminating metal sheets, e.g. copper sheets, with sheets of electrical insulating materials, such as glass fiber reinforced unsaturated polyester resin sheets. Such electrical circuit boards may be either rigid or flexible, and are further classified as single-sided (metal foil on one side of the insulating material only), double-sided (metal foil on both sides of the insulating material), or multi-layered.

The electrical insulating material is a base or support for the metal sheets bonded thereto. The National Electrical Manufacturers Association (NEMA) has established standards for various base materials. Standards for polyester glass-mat sheet laminates have been established by NEMA, viz. Grades GPO-1, GPO-2, and GPO-3.

Normally the metal foil, usually copper foil, is secured to the reinforced plastic sheet by means of a suitable adhesive. For example, U.S. Pat. No. 3,700,538 discloses adhesive bonding copper foil to resin-impregnated fiberglass cloth using polyimide resin adhesive. It is also known to add an adhesion promoter to the insulating base material. For example, U.S. Pat. Nos. 3,477,900 and 3,149,021 disclose that when the insulating base material comprises methylmethacrylate resin, then unsaturated polyester may be added to the resin as an adhesion promoter to bond a copper foil. However, these patents disclose that an increase in the proportion of polyester is generally accompanied by a decrease in adhesion of the copper foil to the resinous base. As the proportion of polyester is increased beyond 45 parts by weight, per 100 parts of methylmethacrylate resin, the adhesion falls rapidly to an unacceptable value.

U.S. Pat. No. 4,093,768 discloses that unsaturated polyester resin containing up to about 2% by weight of benzotriazole, incorporated into the resin as an adhesion promoter, can be bonded under pressure directly on a copper foil. Nevertheless, no general method of bonding an unsaturated polyester resin directly on copper foil has heretofore been known.

SUMMARY OF THE INVENTION

The invention provides a continuous process for bonding an unsaturated polyester resin to a metal foil, such as a copper foil. A uniform layer of catalyst-containing polyester resin, optionally containing an adhesion promoter, is applied to a copper foil. Chopped glass fibers are randomly distributed into the resin layer, and the laminate is subjected to a heat treatment to initiate gelation. A second copper foil may be applied to the partially gelled resin. The laminate is thereafter cured in a multi-zone heat treatment.

The process of the invention provides laminates of fiber glass reinforced polyester bonded to copper. These laminates are useful as electrical circuit boards.

DETAILED DESCRIPTION OF THE INVENTION

Figure 1:
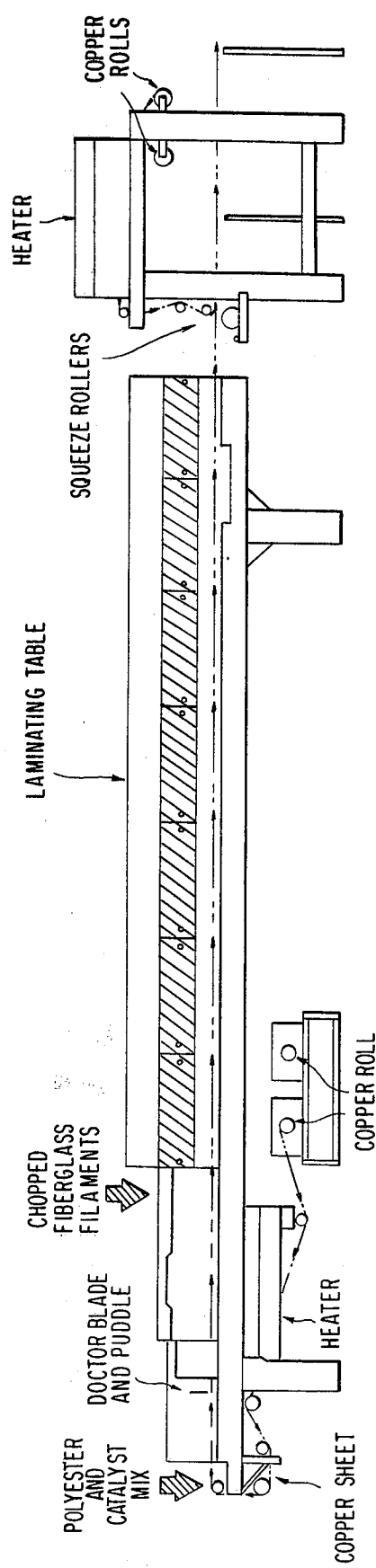
FIG. 1 is a schematic illustration of the process of the present invention.

The present invention provides a continuous process for manufacturing copper-clad polyester-glass fiber laminates, which are useful as electrical circuit boards. Electrical circuit boards employ a copper, or other metal, foil which is subsequently etched away to leave behind portions of the copper foil as electrical conductors. The copper foil thickness is customarily measured in terms of the number of ounces of copper per square foot of the foil. Electrodeposited foil is generally used in the manufacture of electrical circuit boards. Electrodeposited foil is produced by plating from stainless steel drum, from which the copper foil is continuously stripped. The inner surface of the resulting foil exhibits a smooth finish, whereas the outer surface is coarse, thereby promoting improved bonding with the increased surface area. The thickness of the foil is controlled by adjusting the solution concentration and the electrical and mechanical parameters of the plating process. Generally, electrical circuit boards employ copper foil of one or two ounces per square foot thickness. Foils of one ounce per square foot have an approximate thickness of 0.0014 inch (0.0036 cm) whereas two ounce foils have an approximate thickness of 0.0028 inch (0.0071 cm).

The copper foil used in the process of the present invention may be heated before a coating of catalyzed polyester resin is applied. Preheating the copper foil helps to avoid wrinkles and other surface imperfections which might interfere with adhesion of the copper foil to the polyester resin. It is also believed that heating the copper foil makes the foil surface more receptive to adhesion to polyester resin, although the mechanism of this effect is not known.

If desired, a cellophane carrier sheet may be used to support the copper foil. Plain transparent cellophane is suitable for this purpose. Cellophane made from polyethyleneterephthalate may also be used. In general, cellophane ranging from about 48 to about 174 gauge (about 0.12 to about 0.44 cm) may be used. In general, the heavier the copper foil used, the thicker the cellophane carrier sheet should be to minimize stress.

The unsaturated polyester resin used may generally be described as a linear polyester resin capable of cross-linking with vinyl monomers to form thermoset copolymers. Polyester resins comprising phthalic anhydride, maleic anhydride, propylene glycol, ethylene glycol, and styrene are suitable in the process and product of the present invention. Although the process of the present invention is primarily directed toward making rigid electrical circuit boards, the present invention also contemplates the preparation of flexible electrical circuit boards using the present process. To prepare flexible electrical circuit boards, a flexible unsaturated polyester resin is used. Typical flexible unsaturated polyester resins comprise phthalic anhydride, maleic anhydride and diethylene glycol ($HOCH_2CH_2OCH_2CH_2OH$).

The unsaturated polyester resin used in the process of the present invention contains a catalyst to promote cross-linking or theromset structure. The primary consideration in selecting a catalyst is generally the temperature at which the curing process is to be carried out. For any given resin-catalyst system there is an optimum temperature at which the resin can utilize all of the free radicals formed by the catalyst decomposition at that temperature. Above that temperature, peroxide is wasted and below it too much time is required to complete cure. Catalyst useful in the process of the present invention include peroxides such as benzoyl peroxide or methyl ethyl ketone peroxide, or hydroperoxide such as cumene hydroperoxide, or other compounds which decompose to form active free radicals, such as t-butyl perbenzoate. In the process of the present invention, the amount of catalyst used is sufficient to achieve gelation in a time from about 1.5 minutes to about 4 minutes, and to achieve the exothermic stage of curing in a time from about 5 to about 8 minutes. This time interval (to achieve the exothermic curing stage) does not indicate the completion of cure, but merely that the heat being generated by the curing reaction has reached a maximum.

An adhesion promoter may be added to the polyester resin and catalyst to increase the adhesion of the metal foil to the polyester resin insulating material. It has been found that sodium silicate is an effective adhesion promoter in the process of the present invention. Generally, an amount of sodium silicate solution from about 0.1% to about 1% by weight, compared to the polyester resin, may be used in the process of the present invention. Preferably about 0.5% by weight of a sodium silicate solution, compared to the polyester resin, has been found effective as an adhesion promoter in the process of the present invention. A preferred sodium silicate solution, useful as an adhesive promoter in the process of the present invention, is sodium silicate D ®, sold by the PQ Corporation of Valley Forge, Pennsylvania. Sodium silicate D ® is characterized by a $SiO_2/Na_2O$ weight ratio of 2, and a density of 1.53 g/cm$^3$ at 20° C.

Glass fibers are used to reinforce the polyester resins in the process of the present invention. Chopped glass fiber strands are randomly distributed into the resin layer as a reinforcing agent. Glass is particularly useful as a reinforcing agent because of its high tensile strength, high modulus of elasticity, ability to be formed to small diameter fibers, inertness, and low specific gravity compared to equally strong fibers. In the process of the present invention, glass fiber strands are chopped into filaments about two inches long, and randomly distributed into the polyester resin layer. In general, in the process of the present invention, the weight of glass fiber filaments distributed into the polyester resin is from about 10% to about 30% by weight compared to the resin, preferably from about 10% to about 20% by weight compared to the resin, and most preferably from about 12% to about 15% by weight compared to the resin.

Referring to FIG. 1, in the process of the present invention a copper (or other metal) foil, optionally carried on a cellophane sheet (not shown), is coated with a polyester resin mixture containing catalyst. A coating of polyester resin and catalyst is uniformly applied to the sheet of metal foil using a doctor blade set to form a puddle. Chopped strands of fiber glass rope are then randomly distributed across the polyester resin layer carried on the metal foil. The polyester resin coated metal foil then enters a Laminating Table, where a uniform temperature is maintained, which may be adjusted from about 50° F. (10° C.) to about 200° F. (93° C.). The temperature in the Laminating Table is preferably maintained between about 100° F. (38° C.) to about 200° F. (93° C.). The heat in the Laminating Table initiates gelation. In the process of the present invention, the polyester resin coated metal foil preferably moves through the Laminating Table at a speed from about 10 to about 65 feet/min., (about 3 to about 20 meters/min.) and preferably at a speed between about 20 to about 35 feet/min. (about 6 to about 11 meters/min.).

Again referring to FIG. 1, a second metal foil may be applied to the partially gelled polyester resin coated metal foil, leaving the Laminating Table and entering the Squeeze Rolls. As can be seen in FIG. 1, a metal foil sheet, such as a copper foil sheet, passes through a heater, where it is optionally heated to promote adhesion, as discussed above. Again, the metal foil may be supported by a cellophane carrier sheet, if desired. An important feature of the process of the present invention are the Squeeze Rolls shown at the point where the second metal foil meets the partially gelled polyester resin. The squeeze rolls are to be adjusted for the final thickness of the laminate product, and may be adjusted to insure that a puddle of polyester resin forms at this point on the line. That is, the amount of polyester resin permitted through the doctor blade at the beginning of the line is greater than the amount of polyester resin which is permitted to pass between the squeeze rolls when a second metal foil is used. The puddle of polyester resin which forms at this point is important, because it coats the second metal foil sheet before the second sheet touches the partially gelled polyester resin coating on the firrst metal foil. Coating the second metal sheet with polyester resin before it contacts the polyester resin coating on the first metal foil heats the second metal sheet to the temperature of the polyester resin coating on the first sheet. Thus, this aspect of the process of the present invention both eliminates air bubbles and other imperfections which would interfere with the formation of a strong bond between the second metal foil and the partially gelled polyester resin coating. Of course, it will be understood that if a single-sided product, containing a metal foil on one side of the polyester material only, is desired, the second metal foil can be omitted from the process of the present invention. The squeeze rolls apply pressure to the laminate to promote bonding both in the case of a single-sided product, and in the case of a double-sided product. In the process of the present invention, the squeeze rolls are generally set between about 0.010 to about 0.125 inch (about 0.025 to 0.318 cm). In the case of a double-sided product, the squeeze rolls are generally set between about 0.060 to about 0.125 inch (about 0.152 to 0.318 cm).

The laminate is thereafter cured in a multi-zone heat treatment. The oven zones are set up as follows:
(1) Preheat section: from about 250° to 350° F. (about 120° to 175° C.) to bring the laminate up to cure temperature quickly;
(2) Gelation section: in the range from about 100° to 350° F. (about 38° to 175° C.). Temperature control in this zone must be carefully controlled to avoid runaway of the curing reaction;
(3) Exotherm section: usually no heat is supplied since the curing resin is reaching its maximum temperature in this zone; and
(4) Finish off-section: in the range from about 300° to about 500° F. (about 150° to 260° C.) to finish off curing the laminate.

After curing, the laminate is edge-trimmed to produce the desired width. Cellophane carrier sheets, if used, are also removed from the laminate after curing. Trimming is accomplished by shearing. When shearing single-sided copper-clad laminate into smaller blanks, the foil side should face upward with the polyester base material against the shear table. By cutting through the foil side first, there is less tendency to tear the foil away from the edge of the blank.

Figure 2:
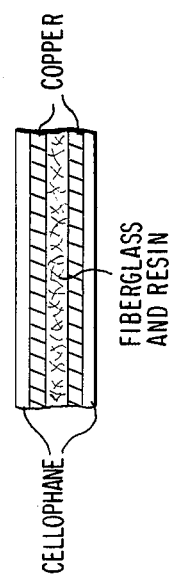
FIG. 2 is a schematic illustration of a copper-clad polyester-glass fiber laminate according to the present invention, including optional cellophane carrier sheets.

FIG. 2 illustrates a laminate product produced by the process of the present invention. A double-sided product is illustrated, with cellophane carrier sheets. As noted above, the cellophane carrier sheets are removed from the laminate after curing.

Although the process of the present invention is particularly useful for bonding copper foil to a polyester resin base for manufacturing an electrical circuit board, other metals may be employed in the process of the present invention. For less costly printed circuit boards, aluminum film may be substituted for the copper foil in the process of the present invention. Silver or gold foil may also be utilized for special purposes, and tantalum or titanium for resistant circuits. In addition to electrical circuit boards, the process of the present invention may be used to produce structural laminates, for example by bonding an aluminum foil to a corrugated polyester resin base.

It is understood that various other modifications will be apparent to and can readily be made by those skilled in the art without departing from the scope and spirit of this invention. Accordingly, it is not intended that the scope of the claims appended hereto be limited to the description set forth above, or the following examples, but rather that the claims be construed as encompassing all the features of patentable novelty which reside in the present invention, including all features which would be treated as equivalents thereof by those skilled in the art to which the invention pertains.

EXAMPLES

Using the process illustrated in FIG. 1, a one ounce copper foil, 26 inches wide, sold by Califoil Corporation of San Diego, Calif. (Califoil HDO-brand copper foil) was used to prepare a double-sided electrical circuit board. The polyester resin, containing 0.1% by weight of cellulose acetate butyrate, was manufactured by Alpha Resins, a division of the Alpha Corporation of Collierville, Tenn. (Alpha polyester resin 59-60101). A catalyst was incorporated into the polyester resin in the following manner. To 200 lbs. of polyester resin, the catalyst system included 2 lbs. of cumene hydroperoxide, 0.4 lbs. of benzotrimethylammonium chloride, and 0.1 lbs. of a 16% by weight solution of zinc (Zinc 16 brand by Tenneco Corporation).

The first (bottom) copper foil was supported by a plain transparent cellophane sheet of 174 gauge. The catalyst-containing polyester resin was poured on the copper foil at a rate sufficient to form a puddle to insure a uniform coating. The doctor blade was set at 0.105 inch (0.267 cm.). Moving at a line speed of about 22 ft./min. (about 6.70 meters/min.), chopped glass fibers amounting to 14% by weight, compared to the weight of the polyester resin, were randomly distributed into the polyester resin layer. The laminating table was operated at a temperature of 175° F. (80° C.). A second (top) copper foil was applied to the partially gelled resin. The second copper foil was of the same material as the first copper foil, and was supported on a plain transparent cellophane carrier of 48 gauge. The chopped glass fibers were made by chopping fiber glass rope (Owens-Corning 990) into two inch filaments.

The squeeze rolls were set at 0.080 inch (0.20 cm.) and the curing zones were set at 300° F. (149° C.) in the preheat section, 250° F. (121° C.) in the gelation section and 400° F. (204° C.) in the finish-off section. The thickness of the double-sided product was 0.060 inch (0.15 cm.).

The process of the above example was repeated using 25% by weight, compared to the resin, of chopped glass fibers, and 30% by weight, compared to the resin, of chopped glass fibers. Similar results were obtained.

The process of the example was repeated using 0.5% by weight, compared to the resin, of sodium silicate D ® solution, as an adhesion promoter. The product of this example exhibited superior adhesion of the copper foil to the polyester resin base.

What is claimed is:

1. A continuous process for preparing a copper foil laminate having at least one sheet of copper foil directly bonded to a face of a sheet of a glass fiber reinforced linear polyester resin, comprising:
    applying a coating of a linear polyester resin to a first copper foil,
    distributing glass fiber filaments on said linear polyester resin coating,
    heating said glass fiber containing linear polyester resin coated copper foil to partially gel said resin,
    applying pressure to said partially gelled linear polyester resin coated copper foil, and
    curing said linear polyester resin.

2. A continuous process for preparing a copper foil laminate as set forth in claim 1, including applying a second copper foil to said partially gelled linear polyester resin coating on said first copper foil immediately after heating said glass fiber containing linear polyester resin coated first copper foil.

3. A continuous process for preparing a copper foil laminate as set forth in claim 1, wherein said copper foil laminate comprises one sheet of metal foil directly bonded to one face of a sheet of glass fiber reinforced linear polyester resin.

4. A continuous process for preparing a copper foil laminate as set forth in claim 1, wherein said sheet of cured glass fiber reinforced linear polyester resin is flexible comprises phthalic anhydride, maleic anhydride and diethylene glycol.

5. A continuous process for preparing a copper foil laminate as set forth in claim 4, wherein said copper foil has a weight of one ounce per square foot.

6. A continuous process for preparing a copper foil laminate as set forth in claim 1, wherein said sheet of cured glass fiber reinforced linear polyester resin is rigid.

7. A continuous process for preparing a copper foil laminate as set forth in claim 6, wherein said copper foil has a weight of one ounce per square foot.

8. A continuous process for preparing a copper foil laminate as set forth in claim 6, wherein said linear polyester resin comprises phthalic anhydride, maleic anhydride, propylene glycol, ethylene glycol, and styrene.

9. A continuous process for preparing a copper foil laminate as set forth in claim 6, wherein said linear polyester resin includes a catalyst selected from the group consisting of peroxides and hydroperoxides.

10. A continuous process for preparing a copper foil laminate as set forth in claim 9, wherein said catalyst is a hydroperoxide.

11. A continuous process for preparing a copper foil laminate as set forth in claim 10, wherein said catalyst is cumene hydroperoxide.

12. A continuous process for preparing a copper foil laminate as set forth in claim 6, wherein said sheet of cured glass fiber reinforced linear polyester resin includes about 10% to about 30% by weight, compared to the resin, glass fiber.

13. A continuous process for preparing a copper foil laminate as set forth in claim 12, wherein said glass fiber is randomly distributed in said linear polyester resin.

* * * * *